AUTOMATIC GAIN CONTROL
Filed Dec. 20, 1957
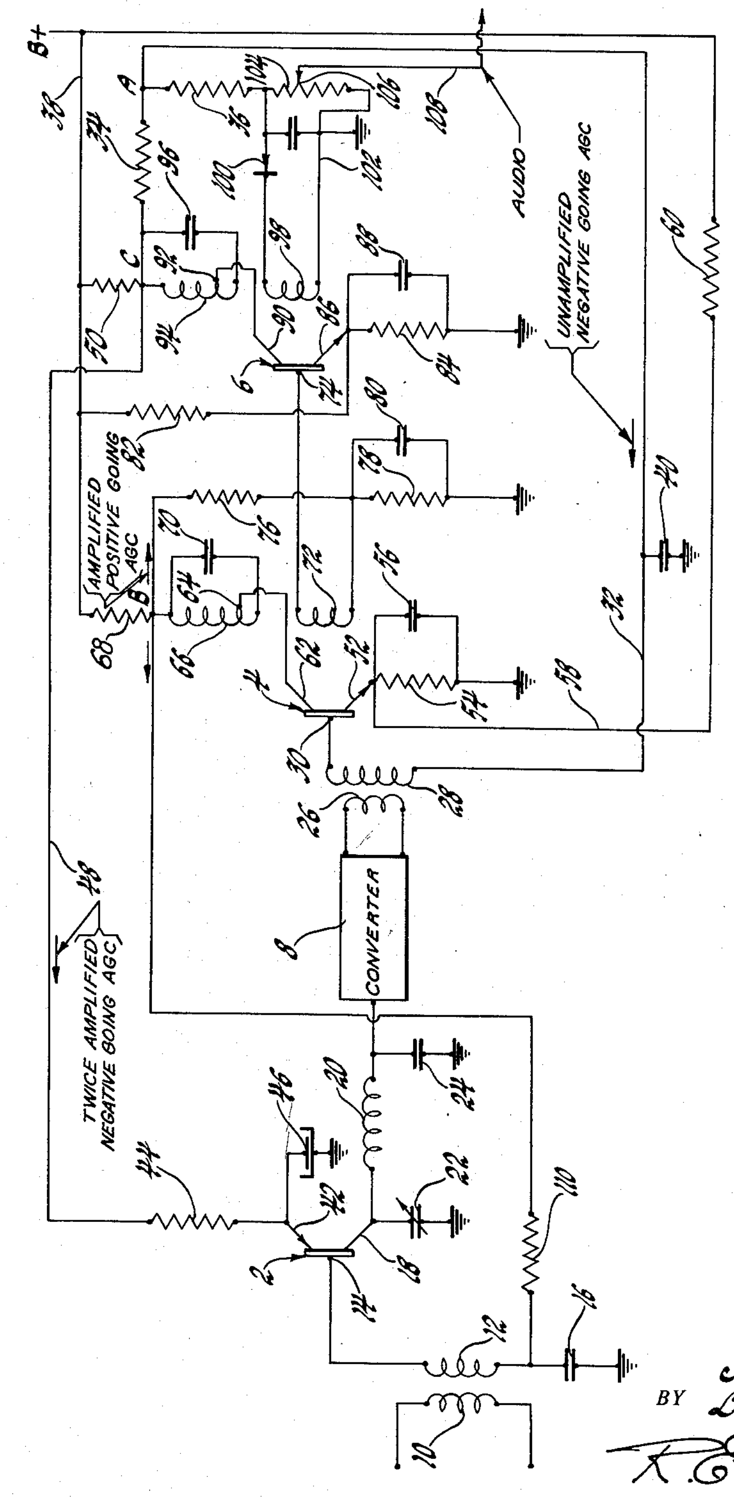
INVENTORS
James H. Guyton &
BY Leslie E. Scott
R. E. Fowler
ATTORNEY United States Patent Office 2,983,815

Patented May 9, 1961

2,983,815

AUTOMATIC GAIN CONTROL

James H. Guyton and Leslie E. Scott, Kokomo, Ind., assignors to General Motors Corporation, Detroit, Mich., a corporation of Delaware Filed Dec. 20, 1957, Ser. No. 704,139

5 Claims. (Cl. 250—20)

This invention relates to transistorized radio receiving means and more particularly to means for applying automatic gain or volume control voltages to a transistorized amplifier.

In order to obtain a sufficiently strong signal to automatically control the gain or volume of transistorized amplifiers or receivers, it has been necessary to utilize at least one stage of amplification in the automatic gain control feedback line. Since transistors are relatively expensive elements this adds appreciably to the cost of the receiver.

It is an object in making this invention to provide an efficient and effective automatic gain control system for a transistorized receiver that does not require any additional amplifying stages.

It is a further object in making this invention to provide an effective gain control system for a transistorized amplifier utilizing a compound reflex circuit.

It is a still further object in making this invention to provide a compound reflexed automatic gain control system for radio receiving means which utilizes feedback from both a first and second IF amplifier stages to control the RF amplifier stage.

It is a still further object in making this invention to provide an automatic gain control system utilizing feedback from the IF amplifier stage to the RF amplifier stage and having a time delay between the application of the control voltage to the IF and RF stages.

With these and other objects in view which will become apparent as the specification proceeds, our invention will be best understood by reference to the following specification and claims and the illustration of the accompanying drawing in which:

The figure is a circuit diagram of the high frequency amplifying section of a transistorized radio receiver embodying the automatic gain control system of our invention.

Referring now more particularly to the figure, there is shown therein a radio frequency amplifying stage including transistor 2, and two intermediate frequency amplifying stages including transistors 4 and 6. The converter stage is shown in block diagram form at 8 as connecting the output of the RF amplifier stage 2 to the input of the IF amplifier stage 4. Incoming signals from the antenna of the receiver are applied to transformer primary coil 10 which is associated with secondary 12, one terminal of the latter being connected directly to base electrode 14 of transistor 2 and the other terminal through condenser 16 to ground. The collector electrode 18 of the transistor 2 is connected through a filter coupling system consisting of inductance 20 and two condensers 22 and 24 to the converter section 8, where the signal is mixed with a locally generated frequency and the output of said converter is the intermediate frequency modulated signal. Transformer primary 26 is shown directly connected across the output of the converter section 8 and provides the input signal for secondary winding 28. One terminal of the secondary 28 is connected directly to the base electrode 30 of the intermediate frequency transitor 4 and the other end of the secondary 28 is connected to line 32. This line extends to a junction between two resistors 34 and 36 which form part of a voltage divider between the power supply line 38 and ground. A condenser 40 is connected between line 32 and ground.

The emitter electrode 42 of the RF transistor 2 is connected to one terminal of a coupling resistance 44 and also through condenser 46 to ground. Resistance 44 is connected through conductive line 48 to a point intermediate resistance 34 and a third resistor 50 which also forms a part of the voltage divider previously mentioned. The emitter electrode 52 of IF transistor 4 is connected through biasing resistor 54 to ground. A condenser 56 is connected in shunt to resistor 54. Emitter 52 is likewise connected through conductive line 58 to one terminal of a resistor 60. The opposite terminal of said resistor 60 is connected directly to line 38 which is the power supply line. This supplies proper bias for the IF transistor. The collector electrode 62 of the IF transistor 4 is connected to a tap 64 on primary winding 66 of a coupling transformer. The remote terminal of the primary winding 66 is connected through limiting resistor 68 to the power supply line 38 to supply proper voltage for the transistor. A condenser 70 is connected across the primary 66 to tune this section to the intermediate frequency of the receiver.

A secondary winding 72 mounted in inductive relation with the primary 66 has one terminal connected directly to the base electrode 74 of the IF transistor 6 and the remaining electrode connected to a point intermediate two resistances 76 and 78, which, together with resistance 68, are connected in series between the power supply line 38 and ground. A condenser 80 is connected in shunt across resistance 78. A further potential divider consisting of series resistances 82 and 84 is connected between power line 38 and ground. The point intermediate these two resistances is connected directly to the emitter electrode 86 of the transistor 6 to provide the proper bias for this electrode. A shunt condenser 88 is connected across resistance 84.

The collector electrode 90 of IF transformer 6 is connected to a tap 92 on the primary coil 94 providing coupling to the further radio apparatus. The remote terminal of the primary 94 is directly connected to line 48 and to a point intermediate resistances 50 and 34. A tuning condenser 96 is connected across the primary winding 94 to tune this section to the intermediate frequency. A secondary transformer winding 98 in inductive relation to the primary 94 has one terminal connected directly to the detector diode 100 and the other terminal connected directly to ground through line 102. The remaining terminal of diode rectifier is connected to a point intermediate resistances 36 and 104. The remaining terminal of resistance 104 is grounded. An adjustable tap 106 movable over the surface of the resistance 104 acts to adjust the volume of the receiver and this is the point at which the audio frequency waves are taken off for application to the audio amplifier. Thus radio frequency signals applied to the input across primary 10 are amplified and detected and appear as audio frequency signals in line 108.

As before mentioned, in transistorized amplifying means it has ben necessary to include an extra stage of amplification in the feedback for automatic gain control in order to have a sufficient amount of signal available. Through the current system the signal developed by the diode 100 is fed back to the first intermediate stage transistor 4 and then ahead to intermediate frequency transistor 6 and back from both these transistors to different parts of the radio frequency stage 2 to provide adequate control. When the input signal applied to primary 10 increases, the voltage appearing at point A between resistances 34 and 36 decreases, as a result of the detection of said signal. Point A is connected back through line 32 to the base 30 of transistor 4. This causes a lower voltage at this point and therefore decreases the current flow through transistor 4 and this reduces the gain of this stage. This decreasing current in transistor 4 causes the voltage at point B to rise which, since this point is connected directly to the base 74 of the IF transistor 6, raises the voltage on that base and as a result, the current through transistor 6 increases. This causes a drop in the voltage at point C. It is to be noted that point C is directly connected through line 48 with the emitter electrode 42 of RF transistor 2 and therefore a lower voltage is applied to the emitter. Simultaneously the increasing voltage at point B is applied through limiting resistor 110 to the base electrode 14 of transistor 2. Thus, voltages from both transistors 4 and 6 are simultaneously applied to the emitter and base electrodes of transistor 2 to tend to cut down the gain which is desired.

It is also desired to point out that the emitter 52 is kept at relatively constant voltage by the voltage dividing supply applied from the power line 38. This voltage divider includes resistances 50, 34 and 54 which are connected in series between the power supply line 38 and ground. Through the use of this circuit, small voltage changes at point A permit a much wider range of control. In like manner a potential divider is used to supply bias voltage to the emitter electrode 86 of transistor 6.

As before mentioned, it has been desirable to apply automatic gain control to the RF amplifier at a slightly delayed time from application to the IF amplifiers. In the past this delay has been provided by including a diode in the AGC line before the RF amplifier. Again, a diode is a relatively expensive component and its elimination will decrease the cost of the apparatus. In the current system the automatic gain control signal appears at the IF amplifying stages and it is then applied to the RF amplifier thus providing the desired delay action, without the addition of any further parts.

With this system therefore, an effective and efficient automatic gain control is obtained in a transistorized amplifier without the addition of an extra amplifying stage in the feedback or the use of a delay diode.

We claim:

1. In amplifying means, a radio frequency amplifier stage and an intermediate frequency amplifier stage connected together to amplify incoming signals in a radio receiver, each stage including at least one electronic device having a plurality of electrodes providing input and output circuits, a detector connected to the output circuit of said intermediate frequency amplifying stage, a resistance connected to said detector and across which detected voltages are developed dependent upon the amplitude of received signals, an output circuit connected to said resistance, means connecting a point in said resistance to one of the input electrodes of a first electronic device in the intermediate frequency amplifier stage to vary the gain thereof with variation in signal strength, a second electronic device having a plurality of electrodes connected to the output circuit of the first electronic device in said intermediate frequency amplifier stage and to the detector to provide further amplification and a plurality of separate conductive means connecting one output electrode of each of the electronic devices in the intermediate frequency amplifier to different input electrodes of the electronic device in the radio frequency amplifier stage to control the gain of the radio frequency amplifier stage.

2. An amplifying system according to claim 1 in which the electronic devices are transistors having base, emitter and collector electrodes and the collector electrodes of the two intermediate stage transistors in order being connected to the base and emitter electrodes respectively of the radio frequency transistor to control the gain.

3. In amplifying means, a source of electrical power, a first, second and third transistor, each having a base, emitter and collector electrode, one electrode of each being connected to said source of electrical power and connected together in cascade to sequentially amplify incoming signals applied to the first transistor, detecting means for detecting signals amplified by the transistors including a resistance and rectifying means connected to the third transistor and developing a voltage proportionate to the incoming signal strength across said resistance, an output circuit connected to said resistance, conductive means connecting an intermediate point in said resistance to the base of the second transistor to apply the voltage in opposed polarity to the base to vary the gain of the second transistor dependent upon said incoming signal strength and further conductive means connecting the collector of the second transistor to the base of the first to provide a properly poled signal thereto to give further gain control of the system.

4. In amplifying means, a source of electrical power, a first, second and third transistor, each having a base, emitter and collector electrode, one electrode of each being connected to said source of electrical power and connected together in cascade to sequentially amplify incoming signals applied to the base of the first transistor, detecting means for detecting signals amplified by the transistors including a resistance and rectifying means connected to the third transistor and developing a voltage proportionate to the incoming signal strength across said resistance, a load circuit connected to said resistance, conductive means connecting an intermediate point in said resistance to the base of the second transistor to apply the voltage in opposed polarity to the base to vary the gain of the second transistor dependent upon said incoming signal strength, further conductive means connecting the collector of the second transistor to the base of the first to provide a properly poled signal thereto to give further gain control of the system and third conductive means connecting the collector of the third transistor to the emitter electrode of the first to apply a third properly poled signal to the emitter to further control the gain.

5. In amplifying means, a source of electrical power, a first, second and third transistor, each having a base, emitter and collector electrode, one electrode of each being connected to said source of electrical power and connected together in cascade to sequentially amplify incoming signals applied to the base of the first transistor, detecting means for detecting signals amplified by the transistors including a resistance and rectifying means connected to the third transistor and developing a voltage proportionate to the incoming signal strength across said resistance, a load circuit connected to said resistance, conductive means connecting said resistance to the base of the second transistor to apply the voltage thereacross in proper polarity to the base to vary the gain of the second transistor dependent upon said signal strength, further conductive means connecting the collector of the second transistor to the base of the first to apply a properly poled signal thereto to give further gain control of the system, a third conductive means connecting the collector of the third transistor to the emitter electrode of the first to apply a properly poled signal to the emitter to further control the gain and independent voltage dividing means connected to said source of electrical power and to the emitter electrodes of the second and third transistors to provide a stable bias for the same.

References Cited in the file of this patent

UNITED STATES PATENTS

| | | |
|---|---|---|
| 2,774,866 | Burger | Dec. 18, 1956 |
| 2,848,603 | Schultz | Aug. 19, 1958 |
| 2,885,544 | Radcliffe | May 5, 1959 |
| 2,891,145 | Bradmiller | June 16, 1959 |
| 2,897,353 | Schweiss | July 28, 1959 |

FOREIGN PATENTS

| | | |
|---|---|---|
| 763,819 | Great Britain | Dec. 19, 1956 |